United States Patent
Kanai et al.

(10) Patent No.: US 6,605,345 B2
(45) Date of Patent: Aug. 12, 2003

(54) ULTRAVIOLET-CURABLE PRESSURE SENSITIVE ADHESIVE COMPOSITION AND ULTRAVIOLET-CURABLE PRESSURE SENSITIVE ADHESIVE SHEET

(75) Inventors: Michio Kanai, Saitama (JP); Hideki Numazawa, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/894,545

(22) Filed: Jun. 28, 2001

(65) Prior Publication Data
US 2002/0019454 A1 Feb. 14, 2002

(30) Foreign Application Priority Data
Jul. 7, 2000 (JP) ........................ 2000-206642

(51) Int. Cl.$^7$ .............................. B32B 15/04; B32B 7/12
(52) U.S. Cl. .................... 428/345; 428/343; 428/344; 428/355 R; 428/704; 522/6; 522/64; 522/68
(58) Field of Search ................. 428/343, 344, 428/345, 355 R, 411.1, 704; 522/6, 64, 68, 109, 110

(56) References Cited

U.S. PATENT DOCUMENTS

| | | | | |
|---|---|---|---|---|
| 4,447,520 A | * | 5/1984 | Henne et al. | 430/281.1 |
| 4,710,523 A | * | 12/1987 | Lechtken et al. | 522/10 |
| 5,218,009 A | * | 6/1993 | Rutsch et al. | 522/100 |
| 5,410,060 A | | 4/1995 | Schroeder et al. | |
| 5,476,565 A | * | 12/1995 | Akada et al. | 156/235 |
| 5,714,029 A | | 2/1998 | Uemura et al. | |
| 5,756,584 A | * | 5/1998 | Bennett et al. | 525/204 |
| 5,942,290 A | * | 8/1999 | Leppard et al. | 427/510 |
| 6,258,426 B1 | * | 7/2001 | Yamamoto et al. | 283/81 |

FOREIGN PATENT DOCUMENTS

| | | | |
|---|---|---|---|
| DE | 199 07 957 A1 | 2/1999 | |
| EP | 0 601 413 A1 | 4/1995 | |
| JP | 60-196956 | 10/1985 | |
| JP | 60-223139 | 11/1985 | |
| JP | 05-032946 | 5/1993 | |
| JP | 08-027239 | 3/1996 | |
| JP | 08124881 A * | 5/1996 | C09J/7/02 |
| JP | 10-130591 A | 5/1998 | |

* cited by examiner

*Primary Examiner*—James J. Seidleck
*Assistant Examiner*—Travis B Ribar
(74) *Attorney, Agent, or Firm*—Webb Ziesenheim Logsdon Orkin & Hanson, P.C.

(57) ABSTRACT

Disclosed is an ultraviolet-curable pressure sensitive adhesive composition comprising an ultraviolet-curable pressure sensitive adhesive component and a phosphorus type photopolymerization initiator. Also disclosed is an ultraviolet-curable pressure sensitive adhesive sheet obtained by coating a substrate with the ultraviolet-curable pressure sensitive adhesive composition. The ultraviolet-curable pressure sensitive adhesive composition is capable of retaining ultraviolet curing properties even if the ultraviolet-curable pressure sensitive adhesive sheet is brought into contact with wash water for a long period of time.

4 Claims, No Drawings

ULTRAVIOLET-CURABLE PRESSURE SENSITIVE ADHESIVE COMPOSITION AND ULTRAVIOLET-CURABLE PRESSURE SENSITIVE ADHESIVE SHEET

FIELD OF THE INVENTION

The present invention relates to an ultraviolet-curable pressure sensitive adhesive composition and an ultraviolet-curable pressure sensitive adhesive sheet obtained by coating a substrate with the adhesive composition. More particularly, the invention relates to a pressure sensitive adhesive sheet used for processing precision parts such as semiconductor wafers.

BACKGROUND OF THE INVENTION

Semiconductor wafers such as silicon wafers and gallium arsenide wafers are manufactured in large diameters, and they are cut (diced) into small chips, followed by a subsequent mounting step. In this case, the semiconductor wafer which has been previously stuck to a pressure sensitive adhesive sheet (dicing sheet) is successively subjected to steps of dicing, washing, drying, expanding, pick-up and mounting.

The dicing step is carried out while spraying the wafer with high pressure water in order to remove dicing dust or heat of dicing.

The dicing sheet used for the above purpose needs to have an adhesive strength of sufficient strength so that the wafer (chip) does not peel off during the dicing operation, and on the other hand, the adhesive strength should be sufficiently weak so that the chip can be readily peeled off during the pick-up operation. Moreover, it is desirable that the dicing sheet leaves no adhesive residue on the back surface of the chip and imparts no stain on the chip.

In view of the above requirements, an adhesive sheet having an ultraviolet-curable pressure sensitive adhesive layer capable of reducing or losing its adhesive strength is used as the dicing sheet. The ultraviolet-curable pressure sensitive adhesive contains an ultraviolet-curable pressure sensitive adhesive component and a photopolymerization initiator as main components.

In the field of electronics, there is always a demand for miniaturization of chips. With miniaturization of chips, the time required for dicing of wafer becomes longer. That is, in order to manufacture a large number of small chips from a wafer of the same size, the distance between the dicing lines should be narrowed, the number of dicing lines should be increased, and the time required for the dicing becomes longer. As a result, the dicing sheet is brought into contact with wash water for a longer period of time.

When the dicing is prolonged as described above, the adhesive strength of the ultraviolet-curable pressure sensitive adhesive layer is not sufficiently lowered even if the dicing sheet is irradiated with ultraviolet light in the pick-up step after the dicing, and hence it becomes difficult to pick up the chips.

The present invention has been made in view of such prior art as mentioned above. Accordingly, the present invention provides an ultraviolet-curable pressure sensitive adhesive composition capable of retaining ultraviolet curing properties even if a dicing sheet using the adhesive composition is brought into contact with wash water for a long period of time. In addition, the present invention provides an ultraviolet-curable pressure sensitive adhesive sheet obtained by coating a substrate with the pressure sensitive adhesive composition of the invention.

SUMMARY OF THE INVENTION

The ultraviolet-curable pressure sensitive adhesive composition according to the invention comprises an ultraviolet-curable pressure sensitive adhesive component and a phosphorus type photopolymerization initiator.

In the present invention, the phosphorus type photopolymerization initiator is preferably an acylphosphine oxide compound, more preferably a compound having a CO—PO bond in a molecule, particularly preferably a compound represented by the following formula:

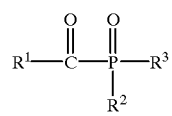

wherein $R^1$ is an aromatic group which may have a substituent, and $R^2$ and $R^3$ are each independently any one of a phenyl group, an alkyl group, an alkoxy group and an aromatic acyl group, each of which may have a substituent.

In the ultraviolet-curable pressure sensitive adhesive composition of the invention, the phosphorus type photopolymerization initiator is preferably contained in an amount of 0.005 to 20 parts by weight based on 100 parts by weight of the ultraviolet-curable pressure sensitive adhesive component.

The ultraviolet-curable pressure sensitive adhesive sheet according to the invention is obtained by coating a substrate with the ultraviolet-curable pressure sensitive adhesive composition.

DETAILED DESCRIPTION OF THE INVENTION

The present invention is described in detail hereinafter. The ultraviolet-curable pressure sensitive adhesive composition according to the invention comprises an ultraviolet-curable pressure sensitive adhesive component and a phosphorus type photopolymerization initiator.

As the ultraviolet-curable pressure sensitive adhesive component, any of various ultraviolet-curable pressure sensitive adhesive components hitherto known is employable without restriction, but in general, a component containing an acrylic adhesive and an ultraviolet polymerizable compound as main ingredients is employed.

As the ultraviolet polymerizable compound for the ultraviolet-curable pressure sensitive adhesive component, there has been widely used such a low-molecular weight compound having at least two photopolymerizable carbon-carbon double bonds in a molecule capable of giving three-dimensional network by light irradiation as described in Japanese Patent Laid-Open Publications No. 196956/1985 and No. 223139/1985. Examples of such compounds include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, and commercially available oligoester acrylates.

In addition to the acrylate compound mentioned above, an urethane acrylate oligomer is also employable as the ultraviolet polymerizable compound. The urethane acrylate oligomer can be obtained by reacting an isocyanate-terminated urethane prepolymer which is obtained by the reaction of a polyester or polyether type polyol compound with a polyisocyanate compound (e.g., 2,4-tolylene diisocyanate, 2,6-tolylene diisocyanate, 1,3-xylylene diisocyanate, 1,4-xylylene diisocyanate, diphenylmethane-4,4-diisocyanate), with an acrylate or methacrylate having a hydroxyl group (e.g., 2-hydroxyethyl acrylate, 2-hydroxyethyl methacrylate, 2-hydroxypropyl acrylate, 2-hydroxypropyl methacrylate, polyethylene glycol acrylate, polyethylene glycol methacrylate).

The quantity ratio between the acrylic adhesive and the ultraviolet polymerizable compound in the ultraviolet-curable pressure sensitive adhesive component is as follows. The ultraviolet polymerizable compound is desirably used in an amount of 50 to 200 parts by weight based on 100 parts by weight of the acrylic pressure sensitive adhesive. In this case, the resulting pressure sensitive adhesive sheet has a high initial adhesive strength, and after irradiation with ultraviolet light, the adhesive strength is greatly lowered. Therefore, separation between the adherend and the ultraviolet-curable pressure sensitive acrylic adhesive layer can be readily made, and the adherend can be picked up.

The ultraviolet-curable pressure sensitive adhesive component may comprise an ultraviolet-curable copolymer having an ultraviolet polymerizable group on its side chain. Such an ultraviolet-curable copolymer has both of adhesion properties and ultraviolet curing properties. The ultraviolet-curable copolymer having an ultraviolet polymerizable group on its side chain is described in detail in, for example, Japanese Patent Laid-Open Publications No. 32946/1993 and No. 27239/1996.

The ultraviolet-curable pressure sensitive acrylic adhesive has sufficient adhesive strength to the adherend before irradiation with ultraviolet light, but the adhesive strength is markedly lowered after irradiation with ultraviolet light. That is, the adherend can be held with sufficient adhesive strength before irradiation with ultraviolet light, but after irradiation with ultraviolet light, the adherend can be readily peeled off.

The ultraviolet-curable pressure sensitive adhesive composition according to the invention comprises such a known ultraviolet-curable pressure sensitive adhesive component as mentioned above and a phosphorus type photopolymerization initiator.

The phosphorus type photopolymerization initiator is a compound containing phosphorus in its molecule, and when the compound is exposed to ultraviolet light, a radical having polymerization initiation ability is formed. As the phosphorus type photopolymerization initiator, an acylphosphine oxide compound is preferable, and a compound having a CO—PO bond in its molecule is more preferable. As the phosphorus type photopolymerization initiator, a compound represented by the following formula is particularly preferably employed.

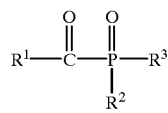

In the above formula, $R^1$ is an aromatic group which may have a substituent, preferably dimethylphenyl, trimethylphenyl, trimethoxyphenyl, dimethoxyphenyl, phenyl or the like.

$R^2$ and $R^3$ are each independently any one of a phenyl group, an alkyl group, an alkoxy group and an aromatic acyl group, each of which may have a substituent.

The phenyl group which may have a substituent is preferably dimethylphenyl, trimethylphenyl, trimethoxyphenyl, dimethoxyphenyl, phenyl or the like, particularly preferably phenyl.

The alkyl group which may have a substituent is preferably 2-methylpropyl, 2,4,4-trimethylpentyl or the like, particularly preferably 2,4,4-trimethylpentyl.

The alkoxy group which may have a substituent is particularly preferably ethoxy.

The aromatic acyl group which may have a substituent is preferably a $R^1$—CO— group ($R^1$ is the same as described above).

Accordingly, examples of the phosphorus type photopolymerization initiators particularly preferably used in the invention include the following compounds.

Bis(2,4,6-trimethylbenzoyl)phenylphosphine oxide

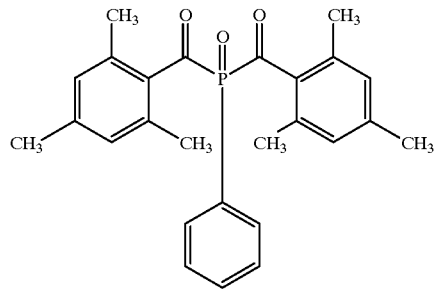

2,4,6-Trimethylbenzoyldiphenylphosphine oxide

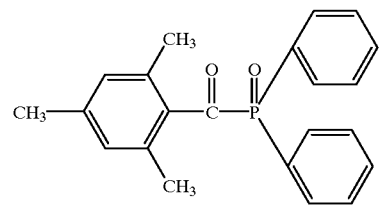

Bis(2,6-dimethoxybenzoyl)-2,4,4-trimethylpentylphosphine oxide

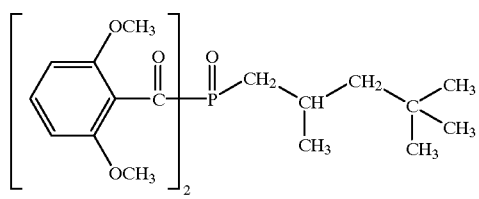

The phosphorus type photopolymerization initiators mentioned above may be used singly or in combination of two or more kinds, and they may be used in combination with other known photopolymerization initiators.

Examples of the photopolymerization initiators employable in combination include photopolymerization initiators, such as a benzoin compound, an acetophenone compound, a titanocene compound, a thioxanthone compound and a peroxide compound; and photosensitizers, such as amines and quinones. Specifically, there can be mentioned 1-hydroxycyclohexyl phenyl ketone, 2-hydroxy-2-methyl-1-phenylpropane-1-one, 2,2-dimethoxy-1,2-diphenylethane-1-one, benzoin, benzoin methyl ether, benzoin ethyl ether, benzoin isopropyl ether, benzyldiphenyl sulfide, tetramethylthiuram monosulfide, azobisisobutyronitrile, dibenzyl, diacetyl, β-chloroanthraquinone and the like.

In the ultraviolet-curable pressure sensitive adhesive composition of the invention, the phosphorus type photopolymerization initiator is contained in an amount of preferably 0.005 to 20 parts by weight, more preferably 0.01 to 10 parts by weight, particularly preferably 0.05 to 1 part by weight, based on 100 parts by weight of the ultraviolet-curable pressure sensitive adhesive component.

In the use of other photopolymerization initiators in combination, the photopolymerization initiators may be contained in the total amount of preferably not more than 20 parts by weight, more preferably not more than 10 parts by weight, particularly preferably not more than 3 parts by weight, based on 100 parts by weight of the ultraviolet-curable pressure sensitive adhesive component.

The phosphorus type photopolymerization initiator can retain ultraviolet curable properties of the ultraviolet-curable pressure sensitive adhesive component even if it is brought into contact with wash water for a long period of time.

Such an ultraviolet-curable pressure sensitive adhesive composition as mentioned above has sufficient adhesive strength to the adherend before irradiation with ultraviolet light, but the adhesive strength is markedly lowered after irradiation with ultraviolet light. That is, before irradiation with ultraviolet light, the adhesive sheet and the adherend are bonded with sufficient adhesive strength so that the adherend can be held on the adhesive sheet, but after irradiation with ultraviolet light, the adhesive sheet can be readily peeled off from the adherend having been diced.

In order to enhance the elastic modulus of the ultraviolet-curable pressure sensitive adhesive composition and to impart larger cohesive force to the composition, a crosslinking agent can be added. The crosslinking agent contributes to three-dimensional crosslinking of the ultraviolet-curable pressure sensitive adhesive composition and imparts sufficient elastic modulus and cohesive force to the composition. As the crosslinking agent, a known compound such as a polyisocyanate compound, a polyepoxy compound, a polyaziridine compound or a chelate compound is employable. Examples of the polyisocyanate compounds include toluylene diisocyanate, diphenylmethane diisocyanate, hexamethylene diisocyanate, isophorone diisocyanate, and addition products of these polyisocyanates and polyhydric alcohols. Examples of the polyepoxy compounds include ethylene glycol diglycidyl ether and diglycidyl terephthalate acrylate. Examples of the polyaziridine compounds include tris-2,4,6-(1-aziridinyl)-1,3,5-triazine and tris(1-(2-methyl) aziridinyl)triphosphatriazine. Examples of the chelate compounds include ethyl acetoacetate aluminum diisopropylate and aluminum tris(ethylacetoacetate). These compounds may be used singly or as a mixture thereof.

The crosslinking agent is added in an amount of preferably 0.005 to 20 parts by weight, more preferably 0.01 to 10 parts by weight, based on 100 parts by weight of the ultraviolet-curable pressure sensitive adhesive composition.

The ultraviolet-curable pressure sensitive adhesive composition of the invention is prepared by appropriately mixing the above components and other components optionally added.

The ultraviolet-curable pressure sensitive adhesive sheet according to the invention is obtained by coating a substrate with the ultraviolet-curable pressure sensitive adhesive composition.

There is no specific limitation on the substrate, and various thin-layer sheets, such as paper, metallic foils, synthetic resin films, are employable. Of these, synthetic resin films are preferably employed from the viewpoints of water resistance and heat resistance. Examples of the synthetic resin films include polyolefin films, such as polyethylene film, polypropylene film, polybutene film and polymethylpentene film; and other films, such as polyvinyl chloride film, polyvinylidene chloride film, polyethylene terephthalate film, polyethylene naphthalate film, polybutylene terephthalate film, polybutadiene film, polyurethane film, ethylene/vinyl acetate copolymer film, ethylene/(meth) acrylic acid copolymer film, ethylene/(meth)acrylate copolymer film, ionomer film, polystyrene film and polyamide film.

The thickness of the substrate is usually in the range of 5 to 300 μm, preferably 10 to 200 μm. The substrate may be a single-layer product of any of the above various films or a laminate of the above various films.

In order to enhance adhesion properties between the substrate and the pressure sensitive adhesive layer, the upper surface of the substrate, namely, the surface to be provided with the ultraviolet-curable pressure sensitive adhesive layer, may be subjected to corona treatment or may be provided with another layer such as a primer coat.

The ultraviolet-curable pressure sensitive adhesive sheet of the invention can be prepared by coating the substrate with the ultraviolet-curable pressure sensitive adhesive composition in an appropriate thickness by a generally known means, such as roll coater, knife coater, gravure coater, die coater or reverse coater, and then drying the coated layer. The thickness of the adhesive layer formed from the ultraviolet-curable pressure sensitive adhesive composition is in the range of usually 1 to 100 μm, preferably 5 to 50 μm. After the preparation, a release sheet may be attached to the ultraviolet-curable pressure sensitive adhesive layer when needed in order to protect the adhesive layer.

Next, application of the ultraviolet-curable pressure sensitive adhesive sheet of the invention to the semiconductor wafer processing is briefly described.

When a release sheet is provided on the upper surface of the pressure sensitive adhesive sheet, the release sheet is first removed, then the pressure sensitive adhesive sheet is placed in such a manner that the pressure sensitive adhesive layer is on the upper side, and a semiconductor wafer to be diced is stuck to the surface of the pressure sensitive adhesive layer. Then, the wafer in this state is successively subjected to dicing, washing and drying. In these steps, the wafer chips are sufficiently adhered and held on the pressure sensitive adhesive sheet, so that the wafer chips do not fall off from the pressure sensitive adhesive sheet during the steps.

Subsequently, each wafer chip is picked up from the pressure sensitive adhesive sheet and mounted on a given substrate. Prior to or during the pick-up step, the pressure sensitive adhesive layer of the pressure sensitive adhesive sheet is irradiated with ultraviolet light to polymerize the ultraviolet polymerizable component contained in the ultraviolet-curable pressure sensitive adhesive layer. When the ultraviolet polymerizable component is polymerized by the irradiation of the pressure sensitive adhesive layer with ultraviolet light, the adhesive strength of the pressure sensitive adhesive is greatly lowered, and very low adhesive strength only remains.

The irradiation of the pressure sensitive adhesive sheet with ultraviolet light is preferably carried out from the substrate side surface on which the pressure sensitive adhesive layer is not provided. In this case, the substrate needs to have light transmission properties.

Then, the pressure sensitive adhesive sheet is expanded when needed to enlarge the distance between the chips. Subsequently, the chips are picked up by the use of a pick-up device such as a suction collet and then mounted on a given substrate.

According to the present invention, ultraviolet curing properties of the ultraviolet-curable pressure sensitive adhesive component are retained even if the adhesive sheet is brought into contact with wash water for a long period of time in the dicing step, and pick-up of the chips can be achieved without any trouble.

EXAMPLE

The present invention is further described with reference to the following examples, but it should be construed that the invention is in no way limited to those examples.

In the following examples and comparative examples, "adhesive strength before irradiation with ultraviolet light", "adhesive strength after irradiation with ultraviolet light (without exposure to wash water)" and "adhesive strength after irradiation with ultraviolet light (with exposure to wash water)" were evaluated in the following manner.

Adhesive Strength before Irradiation with Ultraviolet Light

Using each of the pressure sensitive adhesive sheets obtained in the examples and the comparative examples, the 180° peel strength (mN/25 mm) was measured under the following conditions, and the thus measured peel strength was taken as an adhesive strength before irradiation with ultraviolet light.

Conditions for Measuring 180° Peel Strength

On the adhesive sheet placed on a ground surface (Ra: 0.16–0.20 μm) of a Si wafer, a 2 kg rubber roller was reciprocated in an atmosphere of 23° C. and 65%RH to superpose the adhesive sheet to the Si wafer, and after they were allowed to stand for 20 minutes, the peel strength of the pressure sensitive adhesive sheet was measured at a peel rate of 300 mm/min by the use of a universal tensile tester (trade name: TENSILON/UTM-4-100, manufactured by Orientec K.K.) in accordance with JIS-Z0237.

Adhesive Strength after Irradiation with Ultraviolet Light (Without Exposure to Wash Water)

Each of the pressure sensitive adhesive sheets obtained in the examples and the comparative examples, the adhesive layer of which was exposed outside, was irradiated with ultraviolet light from the substrate side by means of Adwill PAD2000m/8 (trade name, manufactured by Lintec Corporation, illuminance: 220 mW/cm², light quantity: 160 mJ/cm², feed rate of nitrogen: 35 l/min)

Using the pressure sensitive adhesive sheet treated as above, the 180° peel strength (mN/25 mm) was measured under the same conditions as described above, and the thus measured peel strength was taken as an adhesive strength after irradiation with ultraviolet light (without exposure to wash water).

Adhesive Strength After Irradiation with Ultraviolet Light (with Exposure to Wash Water)

Each of the pressure sensitive adhesive sheets obtained in the examples and the comparative examples was exposed to wash water under the following conditions, and within 10 minutes after the exposure to wash water, the adhesive sheet was irradiated with ultraviolet light from the substrate side by means of Adwill RAD2000 m/8 (trade name, manufactured by Lintec Corporation, illuminance: 220 mW/cm², light quantity: 160 mJ/cm², feed rate of nitrogen: 35 l/min).

Using the pressure sensitive adhesive sheet treated as above, the 180° peel strength (mN/25 mm) was measured under the same conditions as described above, and the thus measured peel strength was taken as an adhesive strength after irradiation with ultraviolet light (with exposure to wash water).

Conditions for Exposure to Wash Water

The adhesive sheet was adhered to a ring frame, and the pressure sensitive adhesive layer surface of the sheet was exposed to wash water for 60 minutes at a rate of 3 l/min by means of a dicer (A-WD-4000B, manufactured by Tokyo Seimitsu K.K.), followed by spin drying (1500 rpm, 180 seconds).

The ultraviolet-curable pressure sensitive adhesive component, the photopolymerization initiator and the other component used are as follows.

Ultraviolet-curable Pressure Sensitive Adhesive Component A.

Ultraviolet-curable pressure sensitive adhesive component obtained by the reaction of 100 parts by weight of a copolymer (weight-average molecular weight: 650,000) of 85 parts by weight of n-butyl acrylate and 15 parts by weight of 2-hydroxyethyl acrylate with 16 parts by weight of methacryloyloxyethyl isocyanate.

The content of polymerizable double bonds based on 100 g of the ultraviolet-curable pressure sensitive adhesive component was 0.104 mol.

Photopolymerization Initiator B

B1: bis(2,4,6-trimethylbenzoyl)phenylphosphine oxide

B2: 2,4,6-trimethylbenzoyldiphenylphosphine oxide

B3: bis(2,6-dimethoxybenzoyl)-2,4,4-trimethylpentylphosphine oxide

B4: 2,2-dimethoxy-1,2-diphenylethane-1-one

B5: 1-hydroxycyclohexyl phenyl ketone

Crosslinking Agent C

Addition product of toluylene diisocyanate and trimethylolpropane

Example 1

The components shown in Table 1 were mixed in the amounts shown in Table 1 to obtain an ultraviolet-curable pressure sensitive adhesive composition. The pressure sensitive adhesive composition was applied onto a release film (polyethylene terephthalate film having been subjected to release treatment, thickness: 38 μm) and then transferred to a substrate (ethylene/methacrylic acid copolymer film, thickness: 80 μm) to prepare a pressure sensitive adhesive sheet for sticking a wafer thereto, said pressure sensitive adhesive sheet having an ultraviolet-curable pressure sensitive adhesive layer of 10 μm thick.

The results are set forth in Table 1.

Examples 2–3

Comparative Examples 1–2

The components shown in Table 1 were mixed in the amounts shown in Table 1 to obtain an ultraviolet-curable pressure sensitive adhesive composition. The same operations as in Example 1 were conducted except for using this pressure sensitive adhesive composition.

The results are set forth in Table 1.

TABLE 1

| | Adhesive strength (mN/25 mm) | | |
|---|---|---|---|
| | | After irradiation with ultraviolet light | |
| | Before irradiation with ultraviolet light | Without exposure to wash water | With exposure to wash water |
| Ex. 1 | 5490 | 280 | 270 |
| Ex. 2 | 5640 | 130 | 210 |
| Ex. 3 | 5930 | 140 | 280 |
| Comp. Ex. 1 | 6190 | 150 | 1650 |
| Comp. Ex. 2 | 5880 | 270 | 700 |

| | Ultraviolet-curable pressure sensitive adhesive composition (Weight(s) by weight) | | | | | | |
|---|---|---|---|---|---|---|---|
| | Ultraviolet-curable pressure sensitive adhesive component | Photopolymerization initiator B | | | | | Cross-linking |
| | A | B1 | B2 | B3 | B4 | B5 | agent C |
| Ex. 1 | 100 | 0.16 | | | | | 0.062 |
| Ex. 2 | 100 | | 0.6 | | | | 0.062 |
| Ex. 3 | 100 | | | 1.65 | 1.65 | | 0.062 |
| Comp. Ex. 1 | 100 | | | | 6 | | 0.062 |
| Comp. Ex. 2 | 100 | | | | 3.27 | 2.7 | 0.062 |

The adhesive strength of the pressure sensitive adhesive sheets obtained in the comparative examples was not sufficiently lowered after irradiation with ultraviolet light. On the other hand, the adhesive strength of the pressure sensitive adhesive sheets obtained in the examples was sufficiently lowered after irradiation with ultraviolet light in both of a case where exposure to wash water was carried out and a case where exposure to wash water was not carried out.

What is claimed is:

1. An ultraviolet-curable pressure sensitive adhesive composition, having an adhesive strength which is lowered after irradation with ultraviolet light, comprising an ultraviolet-curable pressure sensitive adhesive component and a phosphorus containing photopolymerization initiator selected from acylphosphine oxide compounds represented by the formula:

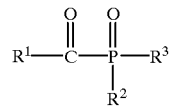

wherein $R^1$ is an aromatic group which may have a substituent, and $R^2$ and $R^3$ are each independently any one of a phenyl group, an alkoxy group, and an aromatic acyl group, each of which may have a substituent.

2. The ultraviolet-curable pressure sensitive adhesive composition as claimed in claim 1, wherein the phosphorus containing photopolymerization initiator is contained in an amount of 0.005 to 20 parts by weight based on 100 parts by weight of the ultraviolet-curable pressure sensitive adhesive component.

3. An ultraviolet-curable pressure sensitive adhesive sheet obtained by coating a substrate with the ultraviolet-curable pressure sensitive adhesive composition of claim 1.

4. An ultraviolet-curable pressure sensitive adjesive sheet obtained by coating a substrate with the ultraviolet-curable pressure sensitive adhesive composition of claim 2.

* * * * *

UNITED STATES PATENT AND TRADEMARK OFFICE
CERTIFICATE OF CORRECTION

PATENT NO. : 6,605,345 B2
DATED : August 12, 2003
INVENTOR(S) : Michio Kanai et al.

It is certified that error appears in the above-identified patent and that said Letters Patent is hereby corrected as shown below:

Column 2,
Line 65, "above, an" should read -- above, a --.

Column 3,
Line 27, "has both of" should read -- has both --.

Column 7,
Line 55, "PAD" should read -- RAD --.
Line 57, after "35 1/m,in)" insert period -- . --.

Column 10,
Line 33, "adjesive sheet" should read -- adhesive sheet --.

Signed and Sealed this

Twenty-third Day of December, 2003

JAMES E. ROGAN
*Director of the United States Patent and Trademark Office*